(12) United States Patent
Jeng

(10) Patent No.: US 7,473,599 B2
(45) Date of Patent: Jan. 6, 2009

(54) MEMORY CAPABLE OF STORING INFORMATION AND THE METHOD OF FORMING AND OPERATING THE SAME

(76) Inventor: Erik S. Jeng, P.O. Box 37-80, Taipei (TW)

( * ) Notice: Subject to any disclaimer, the term of this patent is extended or adjusted under 35 U.S.C. 154(b) by 1 day.

(21) Appl. No.: 11/655,712

(22) Filed: Jan. 18, 2007

(65) Prior Publication Data

US 2007/0147124 A1    Jun. 28, 2007

Related U.S. Application Data

(62) Division of application No. 10/977,603, filed on Oct. 29, 2004.

(51) Int. Cl.
*H01L 21/336* (2006.01)
(52) U.S. Cl. .................. 438/257; 438/201; 438/258; 438/259; 438/261; 438/263; 438/264; 438/266; 438/287; 257/E21.208; 257/E21.209
(58) Field of Classification Search .................. 438/263
See application file for complete search history.

(56) References Cited

U.S. PATENT DOCUMENTS

| | | | |
|---|---|---|---|
| 5,396,458 A | 3/1995 | Shimoji | |
| 5,408,115 A * | 4/1995 | Chang | .................. 257/324 |
| 6,734,055 B1 | 5/2004 | Lin et al. | |
| 6,903,968 B2 | 6/2005 | Jeng | |
| 2004/0071011 A1* | 4/2004 | Nishizaka et al. | ........... 365/154 |

\* cited by examiner

*Primary Examiner*—N Drew Richards
*Assistant Examiner*—Kyoung Lee
(74) *Attorney, Agent, or Firm*—Ming Chow; Sinorica, LLC

(57) ABSTRACT

A method for manufacturing a memory unit capable of storing multibits binary information. A gate is formed on a dielectric layer over a semiconductor substrate. Next, a first etching is performed to etch the semiconductor substrate by using the gate acting as an etching mask to remove exposed surface of the dielectric layer. Subsequently, a first oxide layer is conformally formed on the gate and the semiconductor substrate. An charge-trapping layer is conformally formed on the first oxide layer, and subsequently a second oxide layer is conformally formed on the isolating layer. Next, a second etching is performed to etch the second oxide layer and the charging-trapping layer to form sandwich spacers composed of the second oxide layer/the isolating layer/the first oxide layer on the substrate and the gate sidewall. An ion implantation is performed by using the gate and the spacers acting as a mask to form source/drain doped regions in the semiconductor substrate, wherein junctions of the substrate to the source/drain doped regions locate right under the spacers.

7 Claims, 4 Drawing Sheets

MEMORY CAPABLE OF STORING INFORMATION AND THE METHOD OF FORMING AND OPERATING THE SAME

CROSS-REFERENCE TO RELATED APPLICATION

This application is a divisional of U.S. patent application Ser. No. 10/977,603 filed 29 Oct. 2004.

FIELD OF THE INVENTION

The present invention relates to memory, and more specifically, to a method for manufacturing a memory unit capable of storing single-bit or multi-bits information, wherein the manufacturing process of the memory unit is compatible to the one of the logic switch devices, the memory unit can increase memory density and be capable of storing multi-bits binary information.

BACKGROUND OF THE INVENTION

Electrically Erasable Programmable Read-Only Memory (EEPROM) memory units are popularly adapted to the information electronics. With the advancing technique, the faster EEPROM so-called flash memory has been developed recently to overcome the lower erasing speed, larger area per cell and higher cost of the conventional EEPROM. Basically, a typical EEPROM is formed by a floating gate transistor. During the mode of writing data, a high voltage is applied to a control gate so that the electrons transverses from the drain region into the floating gate through the tunneling oxide layer by the Fowler-Nordheim tunneling effect to increase the threshold voltage. During the mode of erasing data, a high voltage is applied to the source region so that the prior electrons injected into the floating gate flows into the source region or substrate through the tunneling oxide layer to recover original threshold voltage.

In the recent decade, a main object of the development is to consider how to achieve the purpose of efficiently rewriting and erasing a data stored in the flash memory by charging or discharging electrons. Furthermore, higher capacity and lower power consumption are also the goal of the industry at present. The cell is typically the unit of the flash memory. The flash memory is not only characterized with reading, writing capability, but also erasing a sector or page, simultaneously. Therefore, the advantages of the flash memory include the higher reading speed, higher density and lower cost. The flash memory has become a considerably significant device in semiconductor industry.

Please refer to FIG. 1a, where it shows a cross sectional view of a semiconductor wafer illustrating the programming mode of flash memory according to the prior art. During the mode of programming data according to the prior art, a high voltage is applied to a control gate 105 so that the hot carriers are driven from a source region 101a in a silicon substrate 101 into a floating gate 103 through a gate oxide layer 102.

FIG. 1b is a cross sectional view of a semiconductor wafer illustrating the erasing mode of flash memory according to the prior art. During the mode of erasing data, a low voltage or ground potential is applied to the control gate 105 while a high voltage is applied to the silicon substrate 101, thereby driving the electrons from the floating gate 103 into the aforementioned source region 101a through the gate oxide layer 102.

As mentioned above, in the prior art, a set of data can be programmed or erased at one time. The number of the memory units in the flash memory means the number of cells that can be programmed or erased. If there are two sectors that store the data in a single cell, respectively, the device may program or erase two sets of data. Therefore, the capacity of the data set that is programmed or erased by the flash device is twice of the number of the traditional memory units in the flash memory.

SUMMARY OF THE INVENTION

In view of above-mentioned, the object of the present invention is to disclose a method for manufacturing memory units capable of storing single-bit or multi-bits binary information. The method could omit the formation of the floating gate and increase the capability of storing binary information, and therefore improve the performance of the flash memory.

According to the above object, the present invention discloses a method for manufacturing a memory unit capable of storing single-bit or multi-bits binary information. The method comprises the steps of forming a dielectric layer and a gate electrode on a semiconductor substrate. Then, a first etching is performed by using the gate as an etching mask to remove exposed portion of the dielectric layer. A first oxide layer is formed over the gate and the semiconductor substrate. Thereafter, the method includes a step of forming a charge-trapping layer over the first oxide layer, and subsequently forming a second oxide layer over the charge-trapping layer. Then, a second etching is introduced to etch the second oxide layer, the charge-trapping layer and the first oxide layer to form sandwich spacers consisting of the second oxide layer/ the charge-trapping layer/the first oxide layer on the sidewall of the gate. Next, an ion implantation is used by using the gate and the spacers as an etching mask to form a source and a drain doped regions in the semiconductor substrate, wherein junctions of said substrate to the source and the drain doped regions locate right under said spacers. The isolation layer includes nitride layer or a dielectric layer having an energy gap smaller than the first and the second oxide layer.

Finally, an optional metal silicide can be generated on exposed surface of the gate, the surface of the source/drain doped regions by well-known manner. The material of the metal silicide includes TiSi2, CoSi2 or NiSi. The material of the gate includes doped polysilicon or doped epitaxial silicon or combinations of metal silicide and doped polysilicon. The first and the second etching includes an anisotropical etching, such as reactive ion etching (RIE) or plasma etching. Further, the first and the second oxide layer include $SiO_2$, $HfO2$, $ZrO_2$ or dielectric layer having an energy gap greater than the charge-trapping layer.

Another object of the present invention is to disclose an operating method of a memory unit capable of storing single-bit or multi-bits binary information to program and erase the data of the multi-bits binary information provided by the present invention.

According to the above object, a method of programming the status of a memory unit capable of storing single-bit or multi-bits binary information based on aforementioned structure is disclosed. The method comprises applying a gate bias to the gate while applying a drain bias to the first source/drain doped region, and applying a predetermined source current or voltage to the second source/drain doped region, wherein hot carriers are generated and when the first spacer stores carriers therein, the status of the spacers is defined as digital zero, otherwise defined as digital one.

If the drain bias is applied to the second source/drain doped region while applying the predetermined source current or voltage to the first source/drain doped region wherein when the second spacer stores carriers, the status of the spacers is defined as digital zero, otherwise is defined as digital one. Exposing the memory units in UV environment could erase the status in the memory units.

According to the above object, a method of erasing memory units based on the present invention structure comprises applying a gate bias to the gate for erasing while applying a first erasing current or first erasing bias to the first source/drain doped region, and applying a second erasing current or second erasing bias to the second source/drain doped region, such that hetero-carriers current is respectively generated between the first source/drain doped region and the first memory unit, the second source/drain doped region and second memory unit, thereby erasing the first and second memory units.

Based on the aforementioned device structure, the present invention discloses a method of reading the status of the memory units comprises: applying a gate bias to the gate for reading, and applying the drain bias to the second source/drain doped region while applying a predetermined voltage to the first source/drain doped region; wherein when a predetermined amount of channel carrier flow or greater amount xs generated from the first source/drain doped region to the second source/drain doped region, the first memory unit is defined as digital one, otherwise digital zero; applying the drain bias to the first source/drain doped regions while applying the predetermined voltage to the second source/drain doped region, when a predetermined amount of channel carrier flow or greater amount is generated from the second source/drain doped region to the first source/drain doped region, the second memory unit being defined as digital one, otherwise digital zero. The gate bias for reading is greater than the threshold voltage of the memory units.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
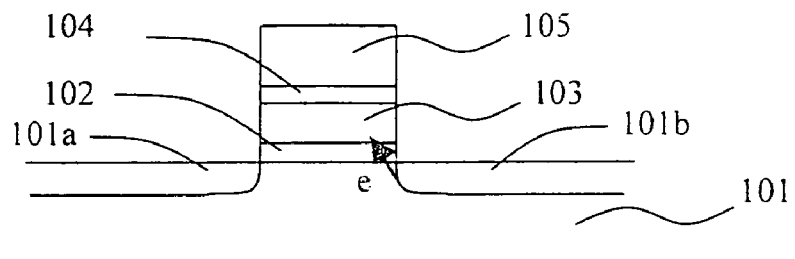
FIG. 1a is a cross sectional view of a semiconductor wafer illustrating the programming mode of flash memory according to the prior art.
Figure 1B:
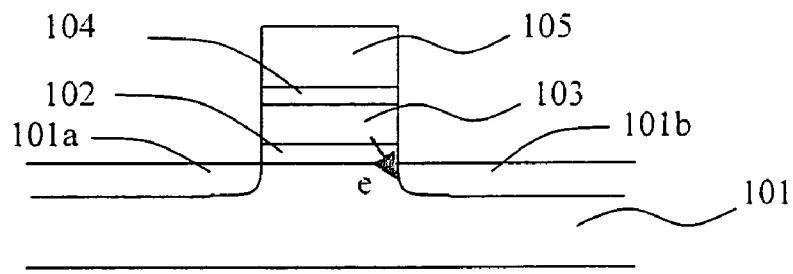
FIG. 1b is a cross sectional view of a semiconductor wafer illustrating the erasing mode of flash memory according to the prior art.
Figure 2A:
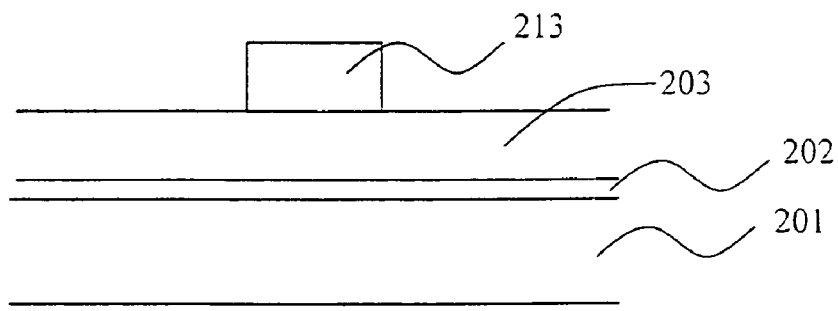
FIGS. 2a-2h are cross sectional views of a semiconductor wafer illustrating the steps of forming a 30 memory unit capable of storing multi-bits binary information according to the present invention.
Figure 2B:
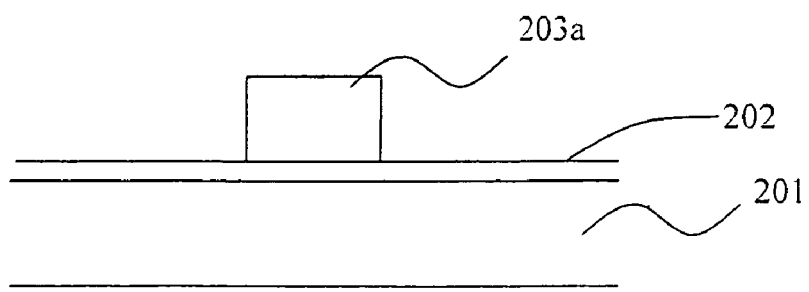

Please refer to FIGS. 2a-2h, showing cross sectional views of a semiconductor wafer illustrating the steps of forming a memory unit capable of storing multi bits binary information according to the present invention. Please turn to FIG. 2a, wherein a gate dielectric layer 202, a conductive layer 203, and a patterned photoresist layer 213 are sequentially formed on a semiconductor substrate 201. For example, the semiconductor substrate 201 comprises a silicon substrate with a crystal orientation of (110) or (100). In one embodiment, the material of the gate dielectric layer 202 includes oxide. The conductive layer 203 includes doped polysilicon or doped epitaxial silicon. As shown in FIG. 2b, an etching is subsequently performed to etch the conductive layer 203 by using the patterned photoresist layer 213 acting as an etching mask to form a gate 203a, thereafter, the patterned photoresist layer 213 is removed. Subsequently, an optional pocket ion implantation is performed by using the gate structure as a mask to form pocket doped regions nearby the gate edge in the substrate.

Figure 2C:
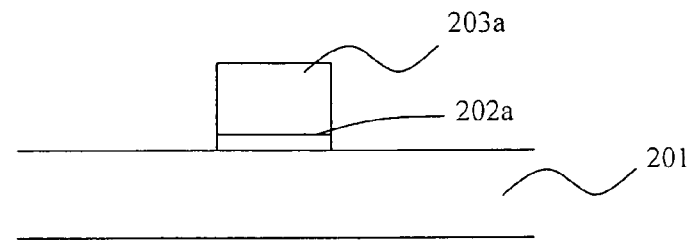
Figure 2D:
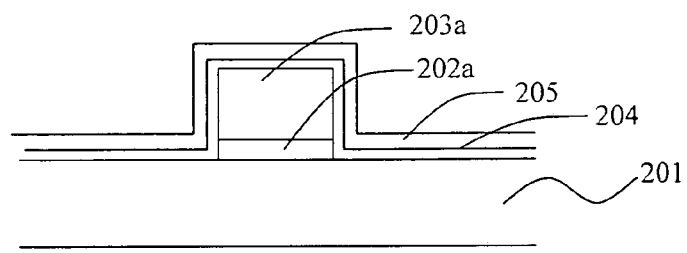
Figure 2E:
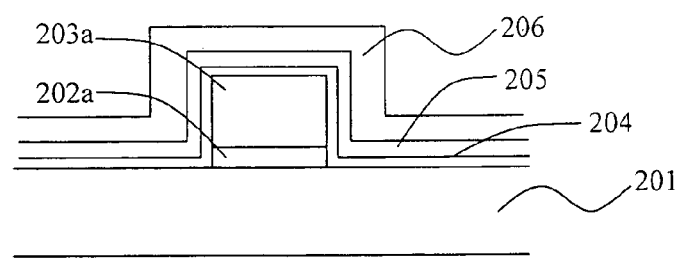

Please refer to FIG. 2c, where the exposed portion of the gate dielectric layer 202 is subsequently removed to leave gate dielectric layer 202a under the gate remaining on the substrate 201. Please turn to FIG. 2d, showing that subsequently, an oxide layer 204 is conformally formed on the gate 203a and the semiconductor substrate 201. For example, the material of the oxide layer 204 includes $SiO_2$ or $HfO_2$ or $ZrO_2$ or the like. Next, a charge-trapping layer 205 is conformally formed on the oxide layer 204. In a preferred embodiment, the chargetrapping layer 205 includes nitride layer or dielectric layer having an energy gap (3-6 eV) smaller than the one of the oxide layer. Next please refer to FIG. 2e, showing that an oxide layer 206 is conformally formed on the chargetrapping layer 205. In one embodiment, the material of the oxide layer 204, 206 can be chosen from a dielectric layer having an energy gap (5-9 eV) greater than the charge-trapping layer 205.

Figure 2F:
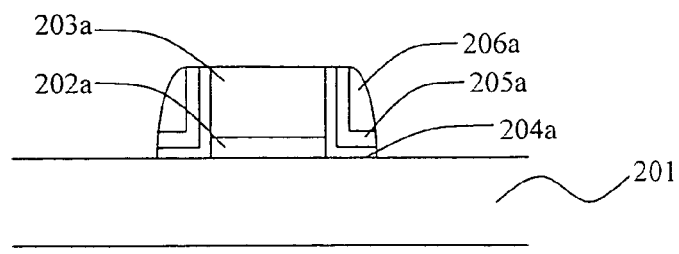
Figure 2G:
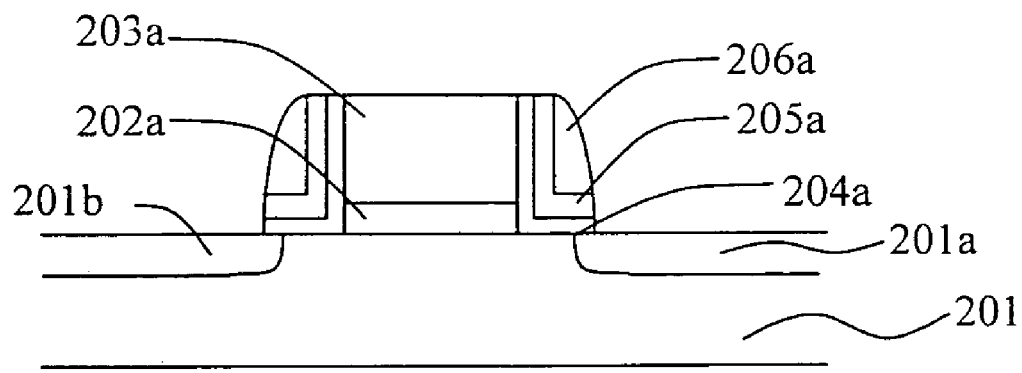
Figure 2H:
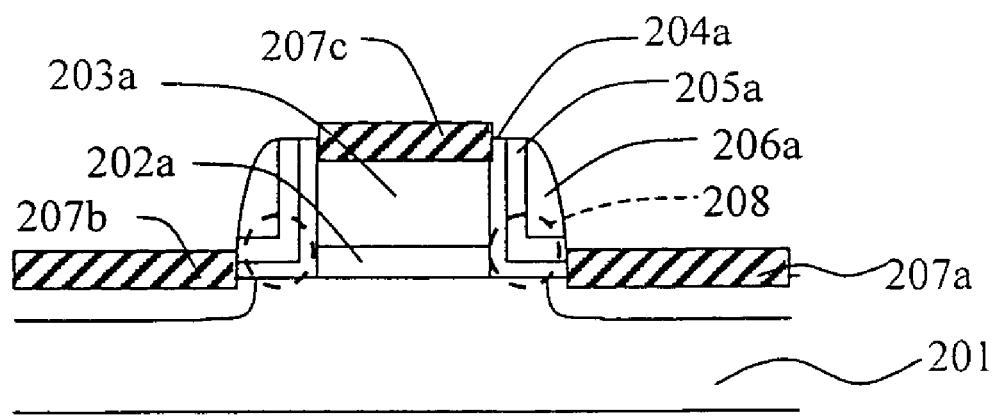

As shown in FIG. 2f, an anisotropical etching is performed to etch the oxide layer 206, the trapping layer 205 and the oxide layer 204, thereby forming sandwich spacers composed of the oxide layer 204a/the trapping layer 205a/the oxide layer 206a on the gate 203a sidewall. In one embodiment, the anisotropical etching is reactive ion etching (RIE) or plasma etching. Subsequently, an ion implantation is performed by using the gate 203a and the spacers 204a/205a/206a as an implant mask to form source and drain doped regions 201a, 201b in the semiconductor substrate 201, as shown in FIG. 2g. Please refer to FIG. 2h, metal silicide layer 207a, 207b, 207c are formed by self-alignment silicide (SALICIDE) on the surface of the gate 203a and the surface of the source, drain doped regions 201a, 201b to reduce the resistance of the contact area including the source/drain and gate. For example, the material of the metal silicide 207a, 207b, 207c includes $TiSi_2$, $CoSi_2$ or NiSi.

Alternatively,the method may perform an etching step to remove dielectrics on the upper surface of the gate structure and the source/drain doped regions, followed by forming the metal silicide on exposed surface of the gate structure and the source/drain doped regions.

Figure 3A:
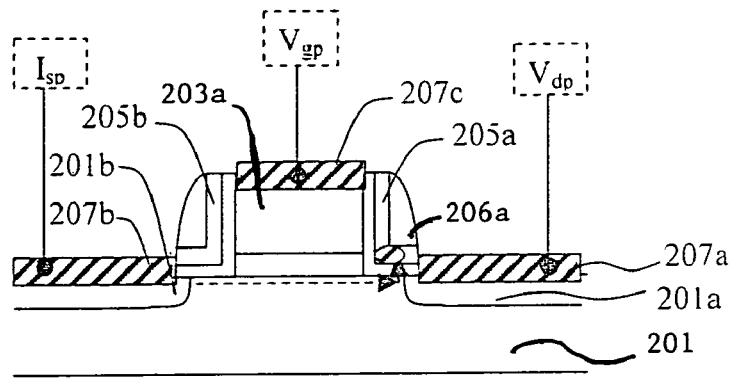
FIGS. 3a-3b are cross sectional views of a semiconductor wafer illustrating the programming mode of a memory unit capable of storing multi-bits binary information by applying a bias and current source according to the present invention.
Figure 3B:
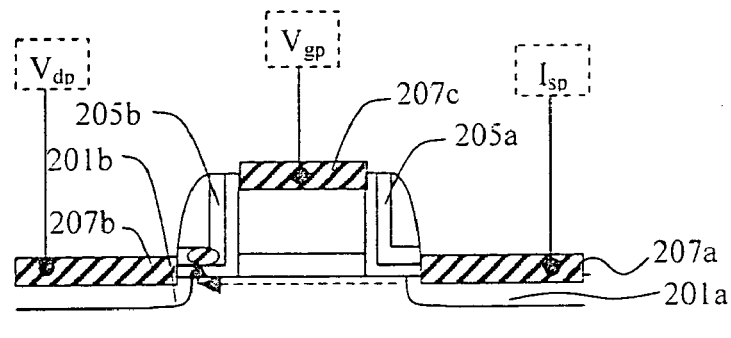

FIGS. 3a-3b are cross sectional views of a semiconductor wafer illustrating the programming mode of a memory unit capable of storing multi-bits binary information by applying a bias and current source according to the present invention.

Please refer to FIG. 3a, showing a gate bias Vgp, approximately 1-10 Volts, is applied to the metal silicide 207c on the gate 203a while a drain bias Vdp, around 1-10 Volts, is applied to the metal silicide 207a on the first source/drain doped regions 201a. A predetermined source current Isp that is approximately 1 nA-1 mA is applied to the metal silicide 207b on the second source/drain doped regions 201b. Channel hot carriers current will be generated near the junction between the first doped region 201a and the semiconductor substrate 201 under the spacer 206a formed between the gate 203a and the first source/drain doped regions 201a. Because the channel under the junction of the source/drain doped regions, the hot carriers will be injected into and be stored in the trapping spacer 205a located adjacent to the first source/drain doped regions 201a. Thus, the carriers from the source doped regions, is trapped by the nitride trapping spacer 205a of the sandwich spacers consisting of the oxide layer/the nitride layer/the oxide layer. The nitride spacer 205a plays the role that is similar to conventional floating gate of flash memory. Therefore, the trapping spacer 205a located at the side of the first source/drain doped regions 201a is defined as digital one "1", on the contrary, the spacer 205b that is free of charges and located adjacent to the second source/drain doped regions 201b is therefore defined as digital zero "0". Consequently, memory unit "XY" is programmed and defined as "X1" or "X0".

Please refer to FIG. 3b, where similarly, if the memory unit "XY" is desired to be programmed as "1Y", the gate bias Vgp for writing (around 1-10 Volts) is applied to the metal silicide 207c on the gate 203a. The drain bias Vdp which is approximately 1-10 Volts for writing is applied to the metal silicide 207b on the second source/drain doped regions 201b, while a source current Isp (approximately 1 nA-1 mA) is introduced to the metal silicide 207a on the first source/drain doped regions 201a. In the semiconductor substrate 201 under the spacer 206b located between the gate 203a and the second source/drain doped regions 201b will occur a channel hot carriers current. Because the channel under the gate keeps a distance from the source/drain doped regions, the hot carriers will be injected and stored in the spacer 205b adjacent to the second source/drain doped regions 201b.

Therefore, the memory unit "XY" is capable of storing multi-bits information which at least includes the status of "00", "01", "10" and "11" by controlling the drain bias Vdp for writing and the predetermined source current Tsp. Wherein, when the memory unit is desired to be programmed as "11", the drain bias Vdp for writing and the predetermined source current Isp are respectively applied on the source/drain doped regions 201a, 201b.

Figure 3C:
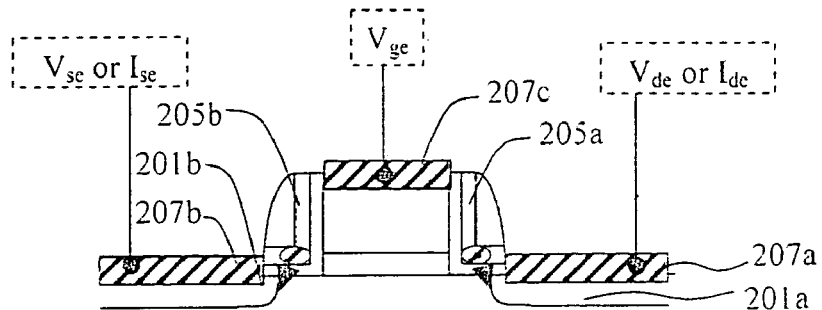
FIG. 3c is a cross sectional view of a semiconductor wafer illustrating the erasing mode of a memory unit capable of storing multi-bits binary information by applying a bias and current source according to the present invention.

FIG. 3c is a cross sectional view of a semiconductor wafer illustrating the erasing mode of a memory unit capable of storing multi-bits information by applying a bias and current source according to the present invention. Please refer to FIG. 3c, showing that a gate bias Vge for erasing, approximately −10-0 Volts, is applied to the metal silicide 207c on the gate 203a, while a predetermined source current Ide, 1 nA-1 mA, is applied to the metal silicide 207a on the first source/drain doped regions 201a. An erasing voltage Vse around 1-10 Volts or a predetermined source current Ise around 1 nA-1 mA is applied to the metal silicide 207b on the second source/drain doped regions 201b.

The status of the spacers 205a, 205b formed adjacent to the first and the second source/drain doped regions 201a, 201b are therefore programmed by the hetero-carriers that is different electricity from the initial carriers stored in the spacers 205a, 205b. The initial trapped carriers stored in the spacers will be neutralized by the hetero-carriers, or the hetero-carriers will attract the initial carriers stored in the spacers 205a, 205b out of the spacers. Consequently, the programmed digital states defined by the charges in the spacers 205a, 205b are therefore erased.

As above-mentioned, the present invention provides a method for manufacturing a memory unit capable of storing multi-bits binary information, and the programmed data type by utilizing the method of the present invention can be decided by controlling the source/drain doped regions status applied by the drain-write voltage and the predetermined source current. The written data can be erased by utilizing the erasing voltage and the predetermined source current. The method of the present invention can efficiently improve data processing quantity and easily execute programming codes to achieve a reducing cost objective.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a memory unit capable of storing single-bit or multi-bits information, said method comprising the steps of:
   providing a substrate with a gate dielectric and a gate structure formed thereon, wherein said gate structure acts as a control gate and a select gate;
   performing an optional pocket ion implantation by using said gate structure as a mask to form pocket doped regions nearby said gate edge in said substrate;
   forming a first oxide layer over said gate structure;
   forming a charge-trapping layer over said first oxide layer, and subsequently forming a second oxide layer over said charge-trapping layer;
   performing an etching to etch said second oxide layer, said charge-trapping layer and said first oxide layer to form sandwich spacers comprised of said second oxide layer/ said charge-trapping layer/ said first oxide layer on the sidewall of said gate structure;
   performing an ion implantation by using said gate structure and said sandwich spacers as a mask to form source/drain doped regions in said substrate, wherein junctions of said substrate to said source/drain doped regions locate right under said sandwich spacers.

2. The method of claim 1, wherein said gate dielectric includes gate oxide layer.

3. The method of claim 1, wherein material of said gate structure includes doped polysilicon or doped epitaxial silicon or combination of metal silicides and doped polysilicon.

4. The method of claim 1, wherein materials of said gate structure includes combinations of metal silicides and doped polysilicon.

5. The method of claim 1, wherein said first and said second oxide layer include $SiO_2$, $HfO_2$, or said gate dielectric having an energy gap greater than said charge-trapping layer.

6. The method of claim 1, wherein said charge-trapping layer includes nitride layer or oxynitride layer or said gate dielectric having an energy gap smaller than said first and said second oxide layer.

7. The method of claim 1, further comprising:
   performing an etching to remove said gate dielectrics on the surface of said gate structure and said source/drain doped regions; and
   forming a metal silicide on exposed surface of said gate structure and said source/drain doped regions.

* * * * *